US010760985B2

(12) United States Patent
Sethi

(10) Patent No.: US 10,760,985 B2
(45) Date of Patent: Sep. 1, 2020

(54) SMART SURFACE SENSOR FOR COLLECTING DATA

(71) Applicant: TDK Corporation, Tokyo (JP)

(72) Inventor: Rakesh Sethi, Saratoga, CA (US)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/018,605

(22) Filed: Jun. 26, 2018

(65) Prior Publication Data

US 2019/0391026 A1 Dec. 26, 2019

(51) Int. Cl.
| | |
|---|---|
| *G01L 5/16* | (2020.01) |
| *G01R 27/22* | (2006.01) |
| *G01L 5/161* | (2020.01) |
| *G01F 23/24* | (2006.01) |
| *G01R 1/04* | (2006.01) |
| *G01R 1/20* | (2006.01) |
| *G01R 3/00* | (2006.01) |

(52) U.S. Cl.
CPC .............. *G01L 5/161* (2013.01); *G01F 23/24* (2013.01); *G01R 1/04* (2013.01); *G01R 1/206* (2013.01); *G01R 3/00* (2013.01); *G01R 27/22* (2013.01)

(58) Field of Classification Search
CPC .......... G01K 5/323; G01K 5/32; G01K 5/326; G01K 2013/026; G01L 7/18; G01L 7/20; G01L 7/182; G01L 13/04; H01H 29/04; H01H 29/30; H01H 29/10

See application file for complete search history.

(56) References Cited

U.S. PATENT DOCUMENTS

| | | | | | |
|---|---|---|---|---|---|
| 3,003,044 | A | * | 10/1961 | Davis ................... | H01H 29/10 200/33 A |
| 3,325,608 | A | * | 6/1967 | Leona ................... | G04F 1/066 200/33 A |
| RE27,556 | E | * | 1/1973 | Corrsin .................. | G01R 22/02 368/114 |
| 3,992,667 | A | * | 11/1976 | Finger ................... | G01R 22/02 324/94 |
| 4,652,710 | A | * | 3/1987 | Karnowsky ............ | H01H 29/04 200/182 |

(Continued)

FOREIGN PATENT DOCUMENTS

DE 102016100573 A1 7/2017

OTHER PUBLICATIONS

Dong et al., "Iowa State Engineers Develop Flexible Skin That Traps Radar Waves, Cloaks Objects," Innovations Report, Jul. 3, 2016, accessed Jun. 26, 2018 at https://www.innovations-report.com/html/reports/information-technology/iowa-state-engineers-develop-flexible-skin-that-traps-radar-waves-cloaks-objects.html. 4 pages.

(Continued)

*Primary Examiner* — Tran M. Tran
(74) *Attorney, Agent, or Firm* — Duane Morris LLP

(57) ABSTRACT

A device includes a channel, a slit, and a cap. The channel is formed on a surface of the device. The slit separates the channel to a first portion and a second portion. The first portion comprises liquid metal, e.g., gallatin. The second portion comprises gas. The liquid metal moves within the channel between the first and the second portions in response to external stimuli, e.g., pressure. The liquid metal moving within the channel changes electrical characteristics, e.g., capacitive value, inductance value, resistance value, resonance frequency, etc., of the device.

15 Claims, 9 Drawing Sheets

(56) References Cited

U.S. PATENT DOCUMENTS

| | | | | |
|---|---|---|---|---|
| 4,797,519 A * | 1/1989 | Elenbaas | ............... | H01H 11/02 200/222 |
| 5,751,074 A * | 5/1998 | Prior | .................... | H01H 29/002 200/190 |
| 6,323,447 B1 * | 11/2001 | Kondoh | ............... | H01H 1/0036 200/182 |
| 6,559,420 B1 * | 5/2003 | Zarev | ................ | H01H 1/0036 200/182 |
| 6,570,110 B2 * | 5/2003 | Narasimhan | ........... | H01H 29/06 200/220 |
| 6,669,647 B2 * | 12/2003 | Letort | ................ | A61B 5/02014 600/486 |
| 6,706,980 B1 * | 3/2004 | Narasimhan | ........... | H01H 29/06 200/220 |
| 6,770,827 B1 * | 8/2004 | Wong | .................... | H01H 29/28 200/182 |
| 6,949,176 B2 * | 9/2005 | Vacca | ................ | B01F 13/0076 204/451 |
| 7,132,614 B2 * | 11/2006 | Beerling | ................ | H01H 29/00 200/182 |
| 7,158,363 B2 * | 1/2007 | Beerling | ............... | H01G 5/0132 361/277 |
| 7,164,090 B2 * | 1/2007 | Beerling | ............. | H01H 1/0036 200/182 |
| 7,183,509 B2 * | 2/2007 | Beerling | ................ | H01H 29/00 200/181 |
| 7,211,754 B2 * | 5/2007 | Wang | .................... | H01H 29/28 200/182 |
| 7,268,310 B2 * | 9/2007 | Beerling | ................ | H01H 29/00 200/182 |
| 7,283,696 B2 * | 10/2007 | Ticknor | .............. | B01F 13/0076 385/129 |
| 7,358,452 B2 * | 4/2008 | Beerling | ................ | H01H 1/0036 200/182 |
| 7,477,123 B2 * | 1/2009 | Beerling | ............. | H01F 17/0006 257/E21.022 |
| 7,488,908 B2 * | 2/2009 | Beerling | ................ | H01H 29/06 200/182 |
| 7,667,946 B2 * | 2/2010 | Choi | .................... | H01G 5/0132 361/277 |
| 8,045,318 B2 * | 10/2011 | Choi | .................... | H01G 5/0132 361/272 |
| 8,276,433 B2 * | 10/2012 | Kupnik | .................... | G01N 5/02 73/31.02 |
| 8,803,641 B2 * | 8/2014 | Rofougaran | ........... | H01H 29/06 200/181 |
| 9,170,166 B2 * | 10/2015 | Pan | ........................ | G01L 9/0072 |
| 9,239,346 B2 * | 1/2016 | Santos | ............... | G01R 27/2605 |
| 9,459,171 B2 * | 10/2016 | Pan | ........................ | G01L 9/0072 |
| 9,714,853 B2 * | 7/2017 | Byers | .................... | G01F 1/7086 |
| 9,739,679 B2 * | 8/2017 | Pan | ........................ | G01L 9/0072 |
| 9,791,398 B2 * | 10/2017 | Clark | .................... | G01N 27/28 |
| 9,978,548 B2 * | 5/2018 | Rohner | ................ | H01H 29/004 |
| 10,126,191 B2 * | 11/2018 | Li | ........................ | G01L 9/0072 |
| 2004/0037708 A1 * | 2/2004 | Murasato | ............. | H01H 29/004 417/99 |
| 2006/0260919 A1 * | 11/2006 | Aimi | ..................... | H01H 11/02 200/83 F |
| 2007/0089513 A1 * | 4/2007 | Rosenau | .................. | G01D 5/24 73/514.32 |
| 2007/0125178 A1 * | 6/2007 | Rosenau | ............... | G01L 9/0095 73/724 |
| 2008/0264506 A1 * | 10/2008 | Beerling | ........... | B01L 3/502792 137/831 |
| 2016/0365198 A1 * | 12/2016 | Pan | ........................... | G01L 1/02 |
| 2018/0143159 A1 * | 5/2018 | Cotton | ................ | H01H 1/0036 |
| 2018/0143265 A1 * | 5/2018 | Nagasaka | ............. | G01R 33/26 |
| 2019/0011476 A1 * | 1/2019 | Zimmermann | ....... | G01P 15/006 |

OTHER PUBLICATIONS

Extended European Search Report in EP Application No. 19178809.0, dated Nov. 29, 2019, in 8 pages.

Khan, M. Rashed, et al. "A pressure responsive fluidic microstrip open stub resonator using a liquid metal alloy." IEEE Microwave and Wireless Components Letters, 22.11 (Nov. 2012): 577-579.

\* cited by examiner

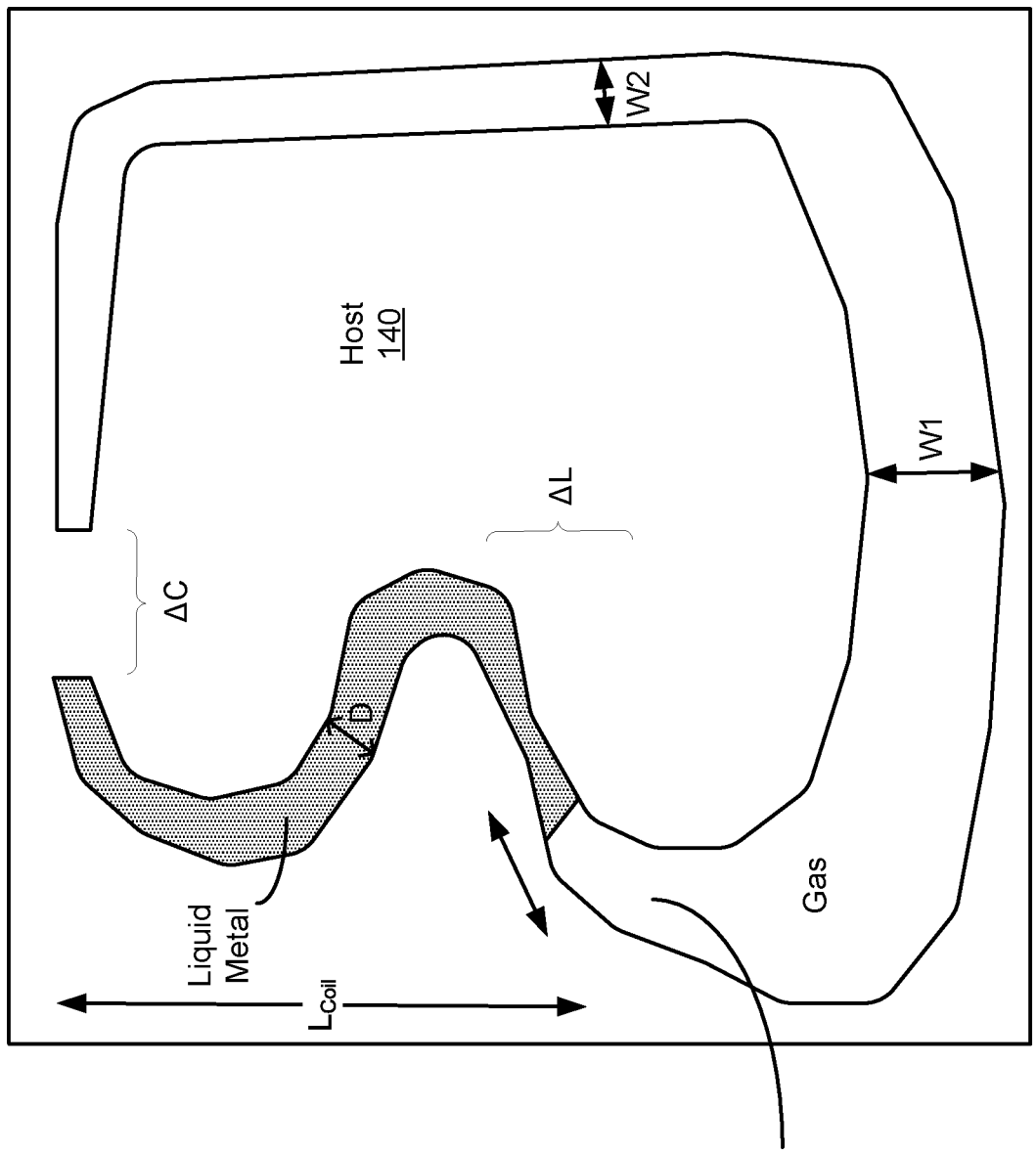
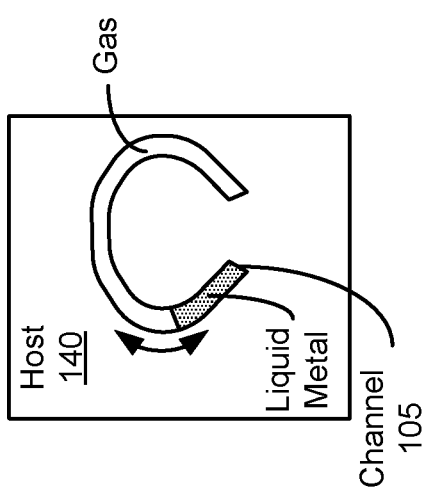
FIGURE 2A
FIGURE 2B

SMART SURFACE SENSOR FOR COLLECTING DATA

BACKGROUND

Many industries have experienced an increased use of electronics and smart devices in recent years. The increased use of electronic devices, for example, advent of artificial intelligence, self-driving vehicles, smart homes, and Internet-of-things (IOTs) has increased the need to gather data and to use sensors. However, it is challenging to integrate bulky sensors into surfaces, e.g., surface of a vehicle.

SUMMARY

Accordingly, there is a need for sensors that can be integrated into any surface and to make that surface a smart surface by collecting data regarding, for example, any ambient condition.

In some embodiments, a device includes a channel, a slit, and a cap. The channel is formed on a surface of the device. The slit separates the channel to a first portion and a second portion. The first portion comprises liquid metal, e.g., gallatin. The second portion comprises gas. The liquid metal moves within the channel between the first and the second portions in response to external stimuli, e.g., pressure. The liquid metal moving within the channel changes electrical characteristics, e.g., capacitive value, inductance value, resistance value, resonance frequency, etc., of the device.

In some embodiments, a method relating to the present disclosure includes forming a metal layer on a host, forming a pathway on the metal layer, forming a separation within the pathway to separate the pathway into a first portion and a second portion, filling the first portion with air, filling the second portion with liquid metal, and encapsulating the metal layer, the pathway, the separation, and the gas in the first portion and the liquid metal in the second portion therein. The encapsulating enables the liquid metal to flow between the first and the second portion and to change length and height associated therewith responsive to an external stimuli.

These and other features and aspects of the concepts described herein may be better understood with reference to the following drawings, description, and appended claims.

BRIEF DESCRIPTION OF DRAWINGS

FIGS. 2A and 2B show geometries of a sensor device in accordance with some embodiments.

DETAILED DESCRIPTION

Figure 1A:
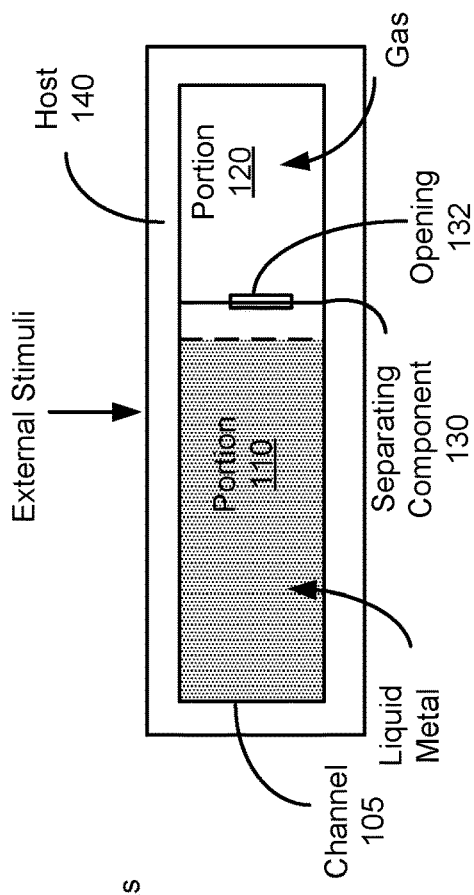
FIGS. 1A-1C show a sensor device in accordance with some embodiments.

Before various embodiments are described in greater detail, it should be understood by persons having ordinary skill in the art that the embodiments are not limiting, as elements in such embodiments may vary. It should likewise be understood that a particular embodiment described and/or illustrated herein has elements which may be readily separated from the particular embodiment and optionally combined with any of several other embodiments or substituted for elements in any of several other embodiments described herein.

It should also be understood by persons having ordinary skill in the art that the terminology used herein is for the purpose of describing the certain concepts, and the terminology is not intended to be limiting. Unless indicated otherwise, ordinal numbers (e.g., first, second, third, etc.) are used to distinguish or identify different elements or steps in a group of elements or steps, and do not supply a serial or numerical limitation on the elements or steps of the embodiments thereof. For example, "first," "second," and "third" elements or steps need not necessarily appear in that order, and the embodiments thereof need not necessarily be limited to three elements or steps. It should also be understood that, unless indicated otherwise, any labels such as "left," "right," "front," "back," "top," "middle," "bottom," "forward," "reverse," "clockwise," "counter clockwise," "up," "down," or other similar terms such as "upper," "lower," "above," "below," "vertical," "horizontal," "proximal," "distal," and the like are used for convenience and are not intended to imply, for example, any particular fixed location, orientation, or direction. Instead, such labels are used to reflect, for example, relative location, orientation, or directions. It should also be understood that the singular forms of "a," "an," and "the" include plural references unless the context clearly dictates otherwise.

Unless defined otherwise, all technical and scientific terms used herein have the same meaning as commonly understood by persons of ordinary skill in the art to which the embodiments pertain.

A need has arisen to create sensors that are smaller and as a result can be incorporated in any surface, e.g., on the wall, on the surface body of a vehicle, on a body of an airplane, etc. In other words, a need has arisen to create sensors that can be integrated into any surface and to make that surface a smart surface by collecting data, e.g., motion data, pressure data, acceleration data, rotational data, temperature data, humidity data, any ambient condition, etc. As a result an array of sensors may be used to increase the surface area for data collection.

In some embodiments, a device includes a channel, a slit, and a cap. The channel is formed on a surface of the device. The slit separates the channel to a first portion and a second portion. The first portion comprises liquid metal, e.g., gallatin. It is appreciated that gallatin referred to herein throughout the application may be referring to Gallium (Ga) and its liquid metal alloy, e.g., indium, tin, etc. However, it is appreciated that any liquid metal may be used as they enable rapid and facile room temperature processing. Thus, the embodiments should not be construed as limited to Gallium. The liquid metals used herein are eutectic alloys that are liquid at room temperature and typically melt at 11° C. (52° F.). Gallatin and its alloy may be desirable because it spontaneously forms an oxide on the surface which dominates the rheological and wetting properties of the metal. In some embodiments, gallatin may be injected, imprinted, or 3D printed on either a soft or hard substrate. In some embodiments, the eutectic mixture may be 68% Ga, 22% In, and 10% Sn, by weight. However, other ranges may also be applicable, e.g., 62-95% Ga, 5-22% In, and 0-16% Sn, while they remain eutectic. The second portion comprises gas. The liquid metal moves within the channel between the first and the second portions in response to external stimuli, e.g., pressure. The liquid metal moving within the channel changes electrical characteristics, e.g., capacitive value, inductance value, resistance value, resonance frequency, etc., of the device.

Figure 1B:
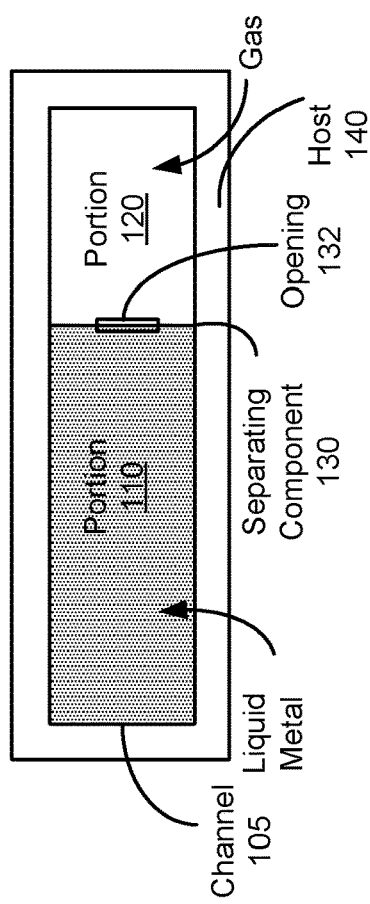
Figure 1C:
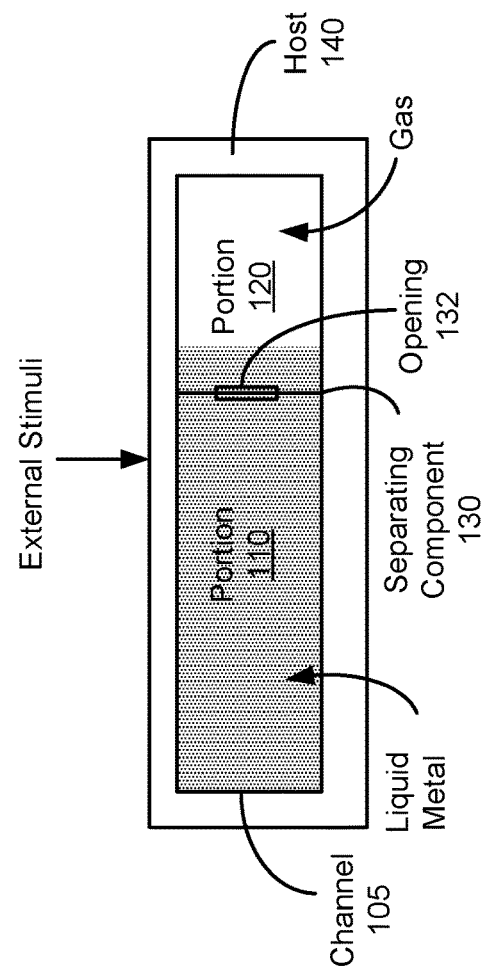

Referring now to FIGS. 1A-1C, a sensor device in accordance with some embodiments is shown. Referring specifically to FIG. 1A, the device may include a host 140 having a channel 105 formed therein. It is appreciated that the channel 105 may be a trench or a pathway configured to allow liquid metal to flow through it in response to an external stimuli. It is appreciated that the host 140 may be a CMOS, a polymer, silicon, glass, etc. The channel 105 may include a separating component 130 to separate the channel into a first portion 110, e.g., chamber, and a second portion 120, e.g., chamber. It is appreciated that the separating component 130 may be a slit, a nozzle, a valve, etc. and that it may have an opening 132 to enable the liquid metal to move within each chamber or within the portions 110 and 120. The first portion 110 may be filled with liquid metal, e.g., gallatin, and the second portion 120 may be filled with gas, e.g., air. It is appreciated that the liquid metal may be liquid at room temperature, which may range between 0-40° C. The device may then be encapsulated, e.g., by a cap, in order to contain the liquid metal and the gas within the first portion 110 and the second portion 120. It is appreciated that the liquid metal may move between the first portion 110 and the second 120 or within the same portion responsive to external stimuli.

Referring now to FIG. 1B, the device is shown when an external stimuli is applied. External stimuli may be pressure, temperature, rotation, acceleration, motion, humidity, ambient condition, etc. It is appreciated that description of the embodiments with respect to external pressure is for illustrative purposes and should not be construed as limiting the scope of the embodiments. As illustrated in FIG. 1B, the liquid metal contracts within the first portion 110 responsive to an external stimuli and as illustrated in FIG. 1C, the liquid metal expands from the first portion 110 into the second portion 120 in response to an external stimuli. In other words, the geometries, e.g., length, width, height, etc., associated with the liquid metal changes by moving between the first portion 110 and the second portion 120. Accordingly, the electrical characteristics, e.g., capacitive value, inductance value, resistance value, resonance frequency, etc., of the liquid metal changes. As such, measuring the change in the electrical characteristics may provide information regarding change in pressure or other external stimuli. It is appreciated that in some embodiments, an encapsulating component that isolates the first portion 110, the second portion 120, and the gas and liquid metal within, moves and/or changes dimensions in response to the external stimuli, e.g., external pressure, that causes the liquid metal to move in response thereto. The encapsulating material may be selected such that it is least wetted by the liquid metal, e.g., gallatin as measured by wettability. Some examples of such encapsulation material may be quartz with suitable composition. Another example of encapsulation may be thin coatings comprising ferro-magnetic or para-magnetic material.

Referring now to FIGS. 2A and 2B, geometries of a sensor device in accordance with some embodiments is shown. Referring specifically to FIG. 2A, the sensor device may be horseshoe shaped, e.g., channel formed and arranged in a horseshoe shape. A portion of the device is filled with liquid metal and another portion is filled with gas, as discussed above. The liquid metal moves between the two portions or within the same portion responsive to external stimuli. Thus, the shape of the liquid metal changes, e.g., height, length, width, etc., as it expands or contracts within the first and the second portions, thereby changing its electrical characteristics, e.g., capacitance value, resistance value, inductance value, resonance frequency, etc. It is appreciated that the shape of the channel where the first portion and the second portion are separated by a separating component may be designed and selected to have a desired capacitance value, desired resistance value, desired inductance value, desired resonance frequency, etc. As such, the measured changes in the electrical characteristics in response to the external stimuli can be used to measure the external stimuli, e.g., pressure.

Referring now to FIG. 2B, another embodiment of the sensor device is illustrated. More specifically, the sensor device may be designed to have any shape. The width of the channel for the sensor may vary, e.g., W1 width at some points and W2 width at a different point. It is appreciated that the depth of the channel may also vary and be non-uniform (therefore the height of the liquid metal in one position of the channel to another position may be different). The liquid metal moving expanding or contracting may result in a change in inductance value, e.g., ΔL, as the length changes and a change in capacitance value, e.g., ΔC. In this illustrative embodiment the inductance value may be determined using the following equation:

$$L_{Coil} = N^2 \mu_0 \mu + \frac{D}{2}\left(\ln\frac{8D}{d} - 2\right)$$

Where N is the number of turns, d is the valve diameter (also referred to as the separating component), and D is the average diameter (loop diameter of the channel) of the liquid metal. μ0 is the permeability of free space and μ is relative permeability. The length of the liquid metal is the $L_{coil}$. In other words, the liquid metal such as gallatin as it expands and/or contract through the channel changes shape and is equivalent to copper coil.

According to some embodiments, the sensor may be formed on a sheet of substrate (also referred to as a host). The host may include a polymer with adhesive properties. In some embodiments, the sensors may be covered with paint polymer or flexible durable glass combination. In other embodiments, the sensor may be integrated within polymers such as paints and resins, thereby making it invisible to human eye and improving its security. It is appreciated that in some embodiments, the geometries and dimensions of the sensor, e.g., the channel, portions, separating component, liquid metal, etc., is such that resonance frequency of visible light spectrum is realized. It is appreciated that the sensor device may have a height less than 50 μm, thereby substantially reducing the sensor's height in comparison to micro-electromechanical system (MEMS).

Figure 3C:
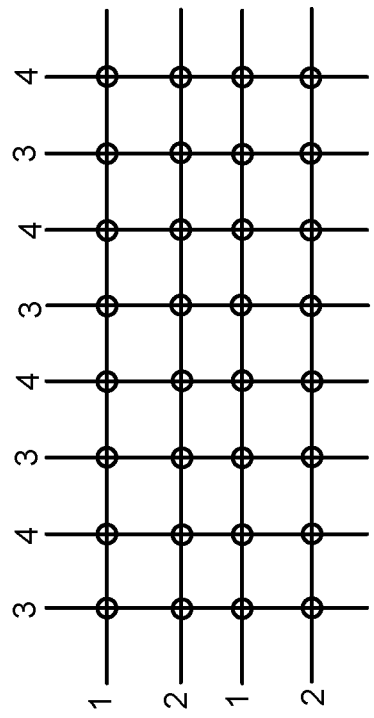
FIGS. 3A-3C show electrical circuitry associated with sensors in accordance with some embodiments.
Figure 3B:
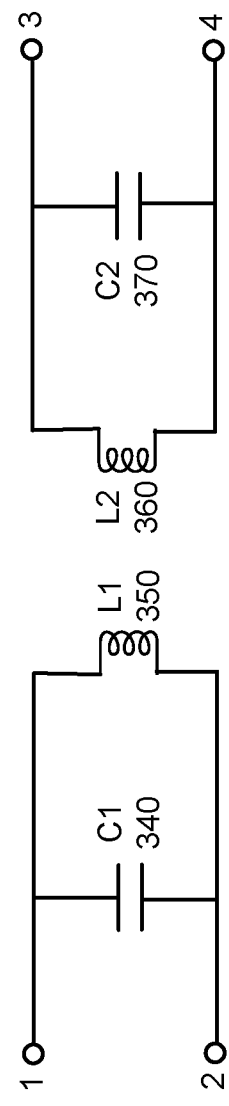
Figure 3A:
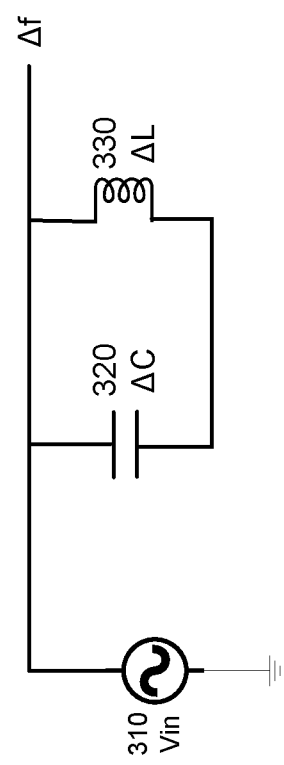

Referring now to FIGS. 3A-3C, electrical circuitry representation associated with sensors, as described in FIGS. 1A-1C and 2A-2B, in accordance with some embodiments is shown. The electrical circuitries of FIGS. 3A and 3B illustrate how the electrical characteristics of the sensor, for example as shown in FIGS. 1A-1C, or FIGS. 2A-2B, changes in response to an external stimuli. For example, referring to FIG. 3A, a voltage source 310 is coupled to a capacitor 320 (change in capacitance value responsive to an external stimuli) which is coupled to an inductor 330

(change in inductance value responsive to an external stimuli). The changes in capacitance value, inductance value, resistive value, etc., result in a change in resonance frequency Δf. The circuitry of FIG. 3A changes the dynamic voltage (e.g., detected resulting from a change in electrical characteristics of the liquid metal responsive to external stimuli) to a change in frequency (frequency counter). As such, the change in frequency can be used to determine the value of the external stimuli, e.g., pressure, change in pressure, etc. For example, the value of the external stimuli may be calculated based on the change in frequency using specific formula. Such a formula may be, for example, obtained by preliminary experiments or theoretical analysis. In some embodiments, the value of the external stimuli may be converted from the change in the frequency to the value of the external stimuli using a conversion table. It is appreciated that the conversion table may be obtained through preliminary experiments, theoretical analysis, etc.

Referring now to FIG. 3B, another electrical circuitry associated with sensors in accordance with some embodiments is shown. FIG. 3B shows nodes 1 and 2 coupled to a capacitor 340 and an inductor 350 and nodes 3 and 4 coupled to a capacitor 370 and inductor 360 in order to create a coupling modulating medium between the two inductors. As such, a frequency counter is created.

Referring now to FIG. 3C, the sensors as described above may be formed into an array, coupled in parallel, series, daisy chained, etc. and coupled through one or more switching mechanisms. In this embodiment, each circle represents a sensor, as described above, and nodes 1, 2, 3, and 4 are nodes of the electrical circuitry in accordance with FIG. 3B. However, it is appreciated that in some embodiments the nodes may be in accordance to nodes of FIG. 3A instead. It is appreciated that any changes shape of the liquid metal, e.g., height, length, width, etc., responsive to the external stimuli may be detected. Changes in electrical characteristics, e.g., change in voltage, capacitance value, resistive value, inductance value, resonance frequency, etc., as detected by the array may be used to determine the value of the external stimuli, e.g., pressure, temperature, humidity, motion, acceleration, rotation, etc.

Figure 4:
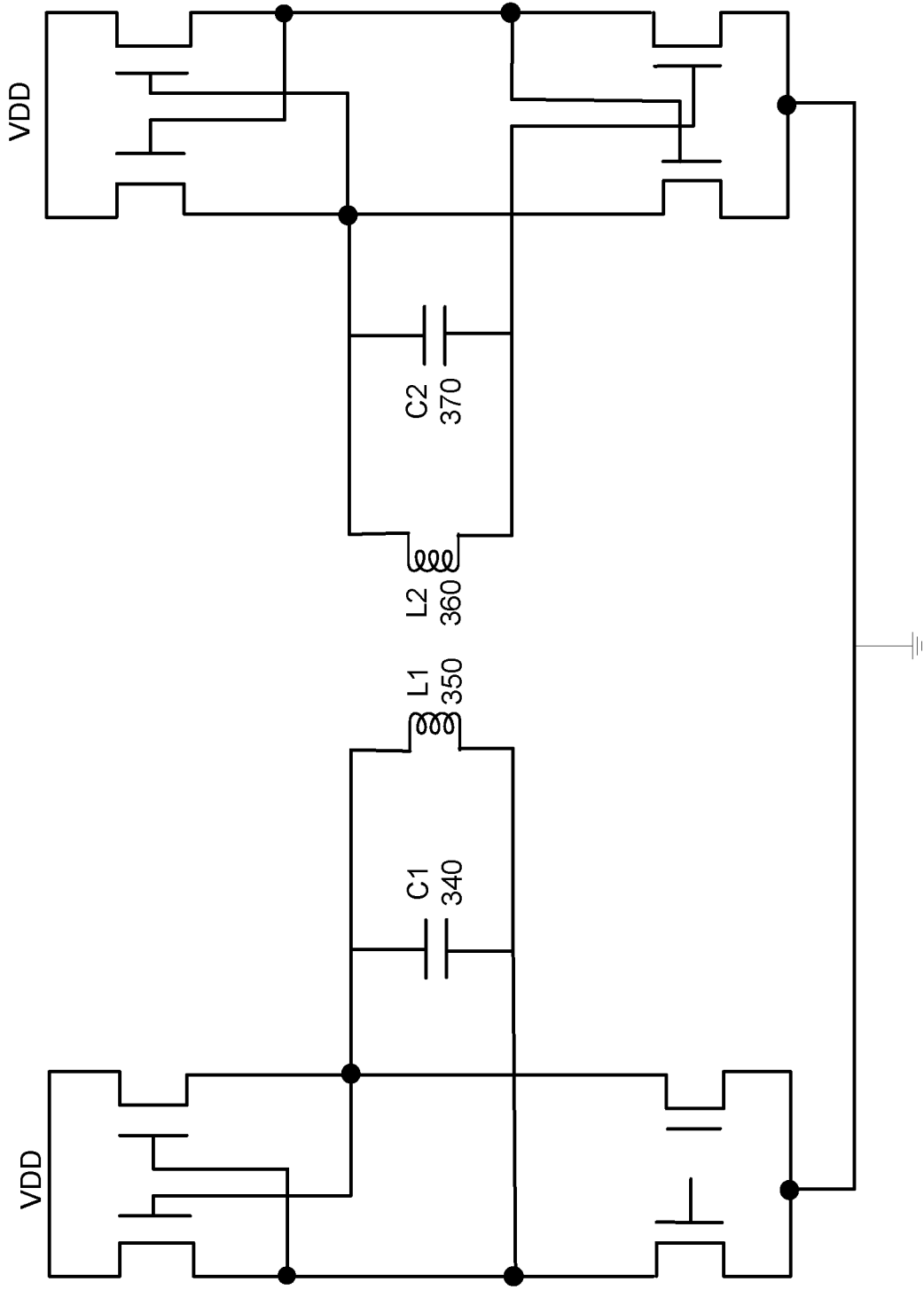
FIG. 4 shows a device in accordance with some embodiments.

Referring now to FIG. 4, a device in accordance with some embodiments is shown. The sensor, as described in FIG. 3B, is coupled to a readout circuitry, as shown in FIG. 4, in order to correlate certain current and/or voltage to its corresponding external stimuli, e.g., pressure, temperature, humidity, etc.

Figure 5:
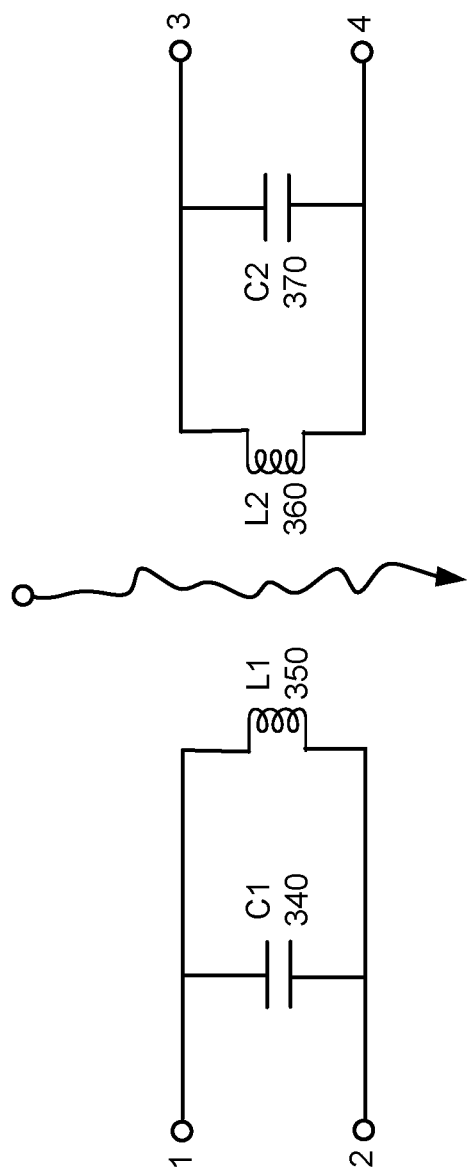
FIG. 5 shows a cancer detection sensor in a microfluidics in accordance with some embodiments.

Referring now to FIG. 5, a cancer detection sensor in a microfluidics in accordance with some embodiments is shown. It is appreciated that the sensor shown can be used to detect cancer cells in a microfluidics. In some embodiments, antibody with magnetic beads may latch on to cancer cell. Magnetic beads are objects, e.g., spherical, that magnetic material structure composite and ferrite cores and may range from nanoscale to micrometer scale. Magnetic beads bind to antibodies and other proteins due to their surface chemistry. As the antibody is passing through between the two inductors 350 and 360, the change, e.g., change in magnetic field, change in frequency, etc., resulting from the magnetic beads is detected and counted. Thus, the number of cancer cells may be determined. It is further appreciated that the sensor may be configured in many different variations to detect a different magnetic bead or electrical characteristics. As such, different cancer cells may be detected.

Figure 6:
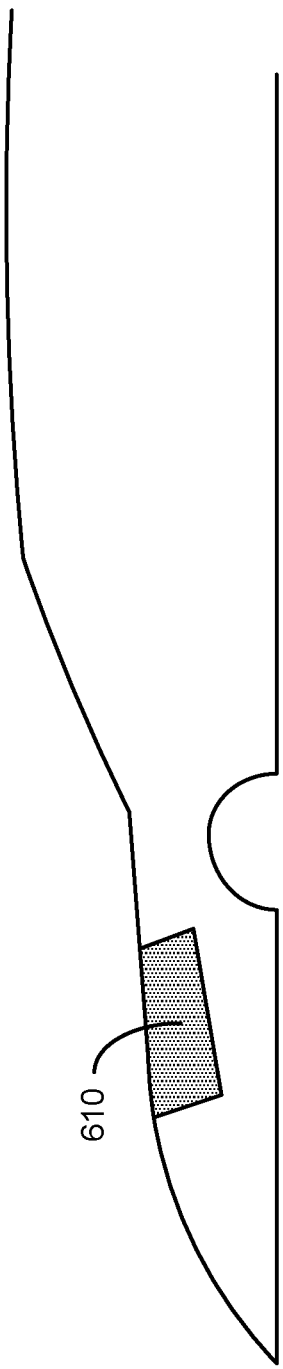
FIG. 6 shows an array of sensors integrated within a surface of a vehicle in accordance with some embodiments.

Referring now to FIG. 6, an array of sensors 610, as described above, integrated within a surface of a vehicle in accordance with some embodiments is shown. The array of sensors 610 may detect and collect data that can improve self-driving technology. For example, the array of sensors 610 may be used to detect motion, thereby avoiding objects, it may be used to detect temperature, thereby used to maintain fluid temperatures to cool the engine, it may be used to detect pressure in case of an accidence, thereby used to reconstruct the accident and to determine speed among other things, etc.

Figure 7A:
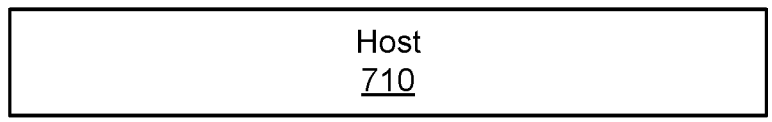
FIGS. 7A-7H show manufacturing a sensor device in accordance with some embodiments.
Figure 7B:
Figure 7C:
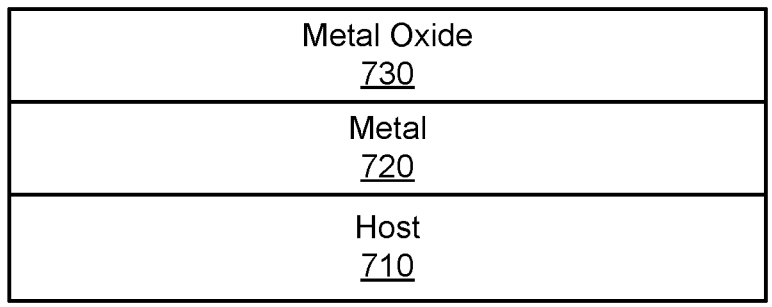
Figure 7D:
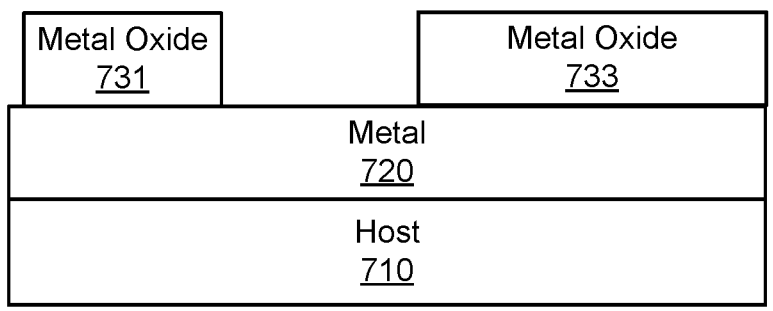
Figure 7E:
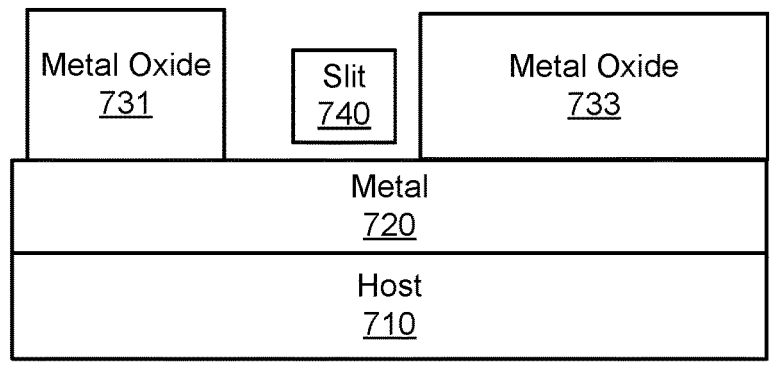
Figure 7F:
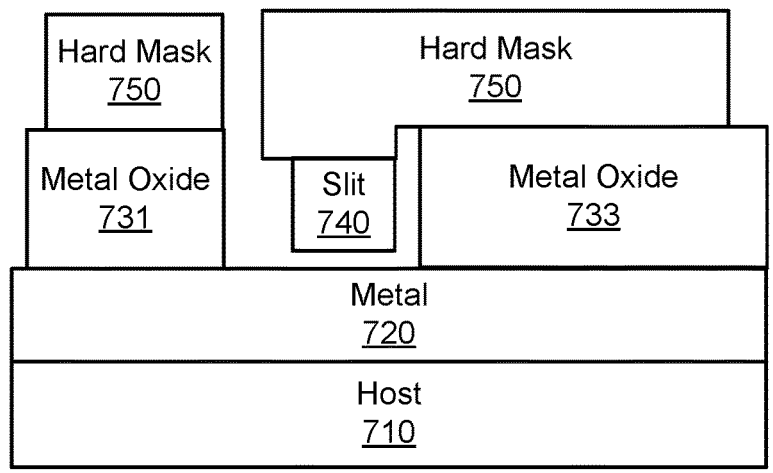
Figure 7G:
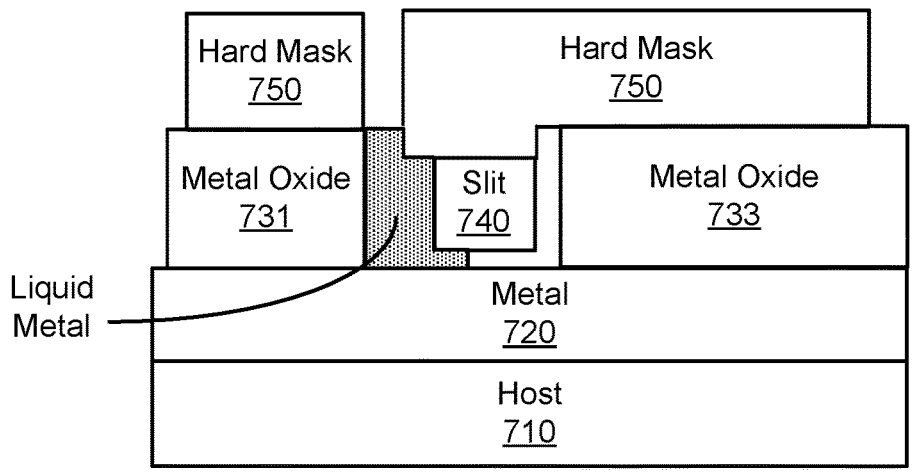
Figure 7H:
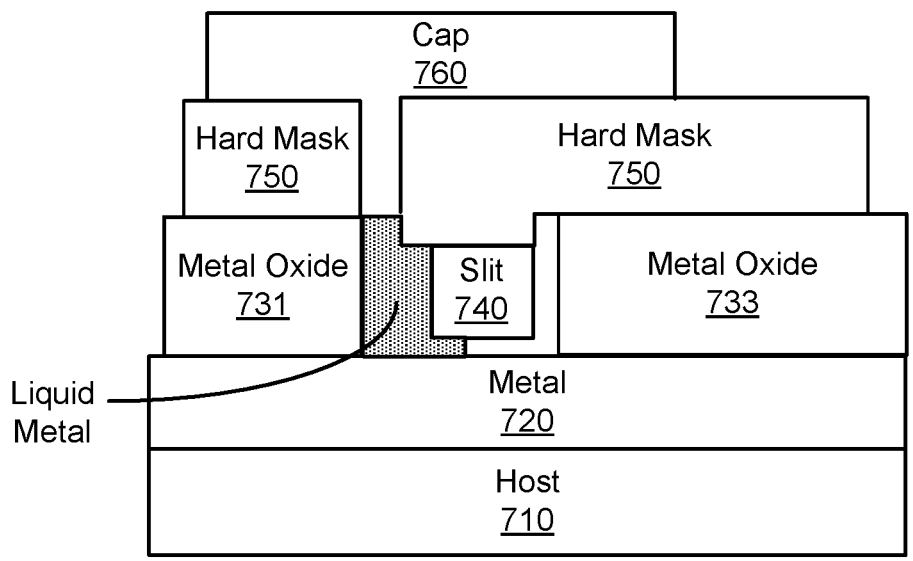

Referring now to FIGS. 7A-7H, manufacturing a sensor device in accordance with some embodiments is shown. FIG. 7A shows a host 710. The host 710 may be a CMOS, a polymer, silicon, glass, etc. A metal 720 layer, e.g., aluminum, is deposited over the host 710, as shown in FIG. 7B. The metal layer 720 may have a thickness of 2000 Å. In some embodiments, a layer of metal oxide 730, e.g., $Al_2O_3$, may be deposited over the metal layer 720 or the metal layer 720 may be oxidized. It is appreciated that the metal oxide 730 may be etched into a desired pattern, e.g., metal oxides 731 and 733, as shown in FIG. 7D. It is appreciated that a separating component, e.g., a slit 740, may be formed on the metal 720 and positioned between the metal oxides 731 and 733, as shown in FIG. 7E. The slit 740 may be formed by removing a portion of the metal 720 underneath through various processes, e.g., wet etch process. In some embodiments, a hard mask 750 may be deposited and formed over at least a portion of the metal oxide, e.g., metal oxide 731, metal oxide 733 or any combination thereof, and further deposited over at least a portion of the slit 740, as shown in FIG. 7F. In some embodiments, the hard mask 750 may be an aluminum hard mask. The hard mask 750 masks the gas chamber of the device (e.g., portion 120). In FIG. 7G, liquid metal, e.g., gallatin, may be deposited within the other chamber of the device (e.g., portion 110) through processes like damascene in CMOS technology. Referring now to FIG. 7H, a cap 760 may be formed over the hard mask 750 and the chamber for containing the liquid metal in order to encapsulate the liquid metal in a chamber and the gas in the other chamber of the device. The liquid metal can move between the two chambers in response to external stimuli, as discussed above. It is appreciated that slit 740 forms a separating component within the trench or channel to create the two portions, one for the liquid metal and the other for maintaining the gas, as described above. Liquid metal moving, expanding, and contracting in response to the external stimuli changes its electrical characteristics that can be measured and correlated to the external stimuli.

Figure 8A:
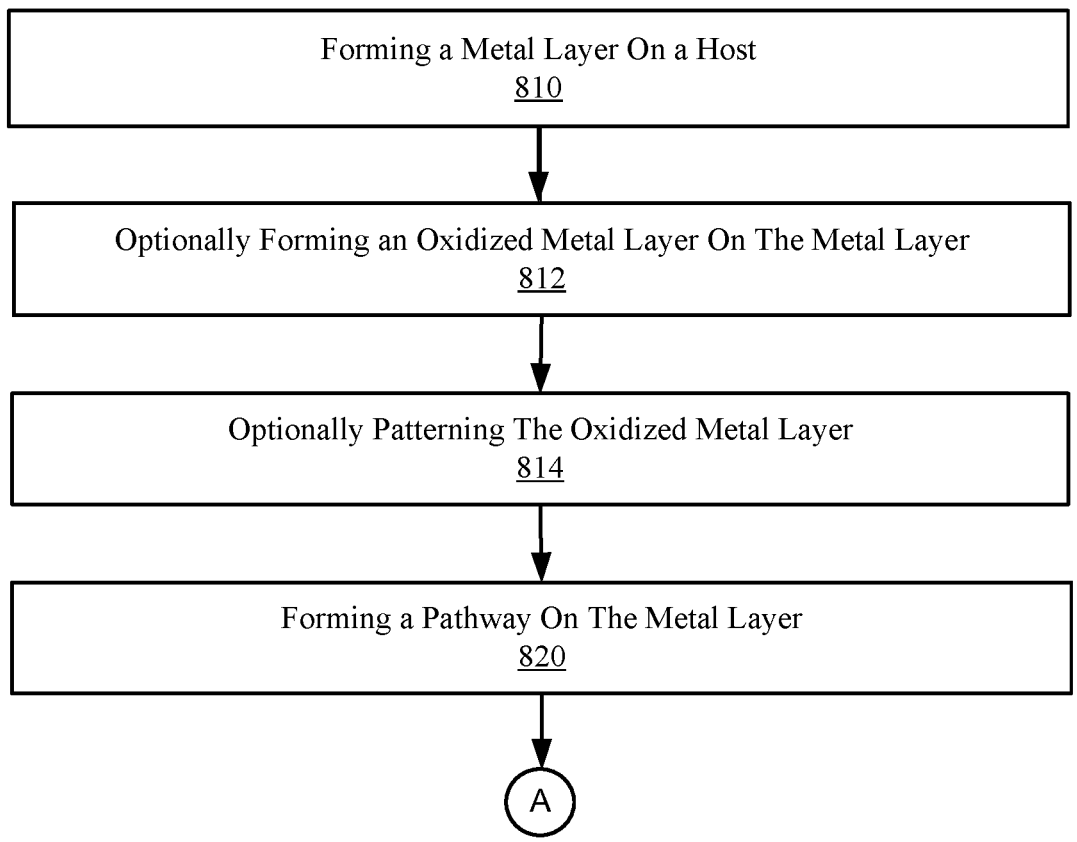
FIG. 8A-B shows an exemplary flow diagram for manufacturing a sensor device in accordance with some embodiments.
Figure 8B:
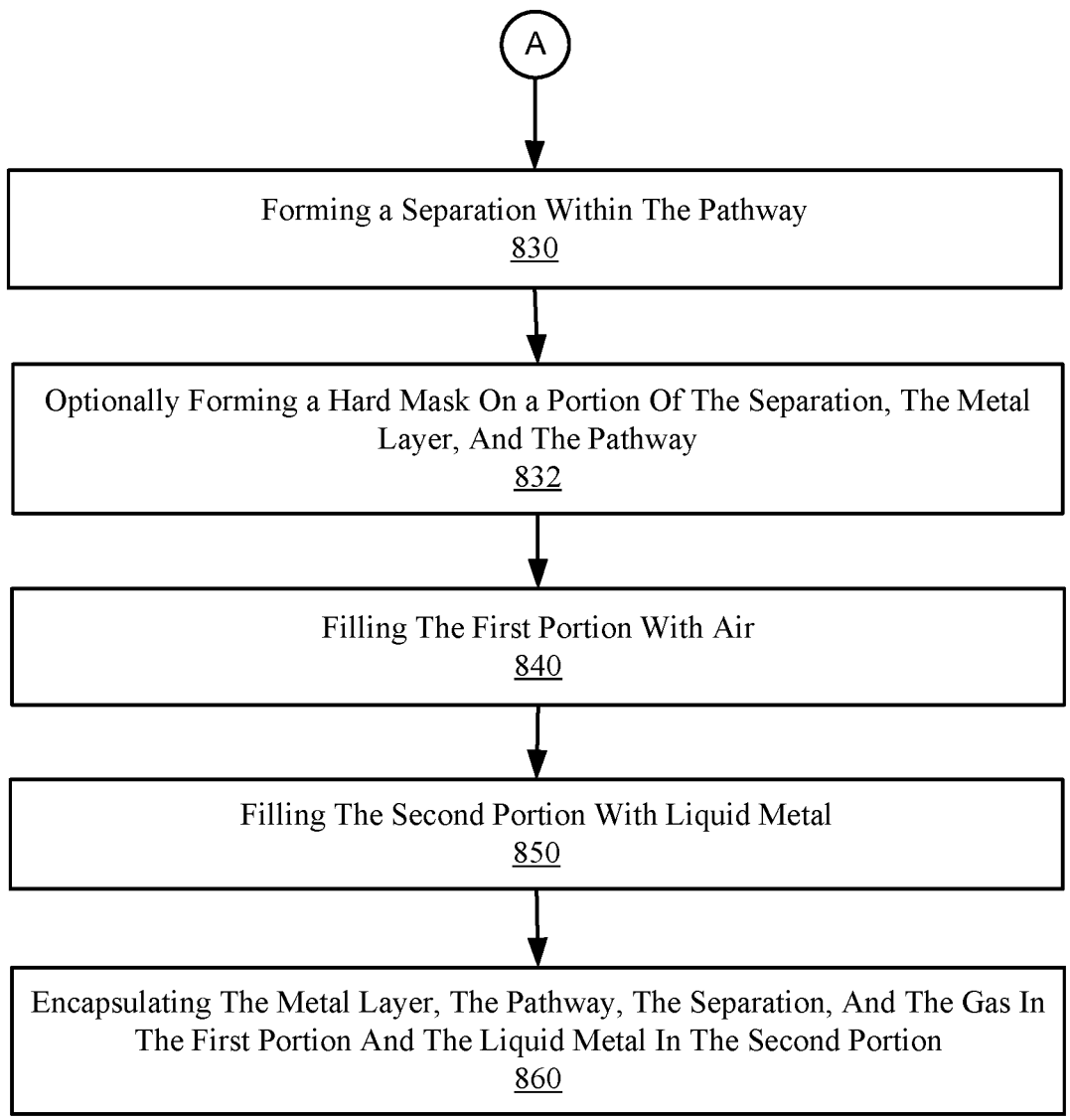

Referring now to FIG. 8, an exemplary flow diagram for manufacturing a sensor device in accordance with some embodiments is shown. At step 810, a metal layer, e.g., aluminum, is formed on a host, e.g., CMOS, polymer, silicon, glass, etc. In some embodiments, the metal layer on the host may be patterned, e.g., etched, wet etched, etc. At step 812, an oxide is optionally formed on the metal layer. It is appreciated that in some embodiments the metal be oxidized, e.g., $Al_2O_3$. At step 814, the oxidized metal layer may optionally be patterned. At step 820, a pathway, e.g., channel, trench, etc., may be formed on the metal layer. It is appreciated that the pathway may be formed through any mean, e.g., etching process.

At step 830, a separation is formed within the pathway. It is appreciated that the separation may be a valve, a slit, nozzle, etc. The separation may be formed through an etching process where for example a portion of the metal underneath is removed to create the separation. At step 832, a hard mask is optionally formed on a portion of the separation, the metal layer, the metal oxide layer, and the pathway or any combination thereof. At step 840, the first portion of the formed pathway is filled with gas, e.g., air and at step 850, the second portion of the formed pathway is filled with liquid metal, e.g., gallatin. It is appreciated that in some embodiments, the second portion is filled with liquid metal using a damascene process. At step 860, the metal layer, the pathway, the separation, the oxidized metal layer, the gas in the first portion of the pathway, and the liquid metal in the second portion of the pathway is encapsulated, e.g., using a cap.

Accordingly, the liquid metal and air is encapsulated, enabling the liquid metal to move within its chamber or between its chamber and the gas chamber responsive to an external stimuli, e.g., pressure. The liquid metal moving, e.g., contracting, expanding, etc., through the channel changes its shape and dimensions and therefore its electrical characteristics, e.g., resistive value, inductance value, capacitive value, resonance frequency, etc. Measuring the change in the electrical characteristics may be used to determine the value for the external stimuli, e.g., pressure, temperature, humidity, motion, acceleration, rotation, etc. Thus, the embodiments described above may be integrated within any surface to enable that surface, e.g., body of the vehicle, etc. to collect data and to make that surface smart. Data collection can be used in various emerging industries such as self-driving vehicles, artificial intelligence, TOT, etc.

While the embodiments have been described and/or illustrated by means of particular examples, and while these embodiments and/or examples have been described in considerable detail, it is not the intention of the Applicants to restrict or in any way limit the scope of the embodiments to such detail. Additional adaptations and/or modifications of the embodiments may readily appear to persons having ordinary skill in the art to which the embodiments pertain, and, in its broader aspects, the embodiments may encompass these adaptations and/or modifications. Accordingly, departures may be made from the foregoing embodiments and/or examples without departing from the scope of the concepts described herein. The implementations described above and other implementations are within the scope of the following claims.

What is claimed is:

1. A device comprising:
   a metal layer having a planar top surface;
   a channel formed on the planar top surface of the metal layer, the channel comprising a first portion and a second portion, wherein the planar top surface of the metal layer provides bottom surfaces of the first and second portions;
   a separating component disposed between and separating the first and second portions, wherein the separating component extends downwardly toward the planar top surface of the metal layer and decreases a height of the channel measured from the planar top surface to a bottom surface of the separating component, wherein the first portion comprises liquid metal and wherein the second portion comprises gas, and wherein the liquid metal expands or contracts within the channel between the first and the second portions in response to external pressure, and wherein the liquid metal expanding or contracting within the channel changes electrical characteristics of the device; and
   a cap encapsulating the channel and the separating component within, wherein the cap changes dimensions in response to the external pressure, thereby causing the liquid metal to expand or contract, and wherein the expansion or contraction of the liquid metal indicates a value of the external pressure.

2. The device as described by claim 1, wherein a height of the device is less than 50 micrometers.

3. The device as described by claim 1, wherein the liquid metal comprises Gallium.

4. The device as described by claim 1, wherein the electrical characteristics are selected from a group consisting of capacitive value, inductance value, and resistance value.

5. The device as described by claim 1 further comprising a circuitry configured to measure the changes in the electrical characteristics of the device and further configured to convert the measure changes to a pressure value associated with the external pressure.

6. The device as described by claim 1, wherein resonance frequency of the circuitry changes in response to the changes in the electrical characteristics.

7. A device comprising:
   a metal layer having a planar top surface; and
   an array of liquid metal sensors formed on the metal layer, wherein each liquid metal sensor of the array of liquid metal sensors comprises:
   a channel formed on the planar top surface of the metal layer such that the planar top surface provides a bottom surface of the channel;
   a separating component configured to divide the channel to a first portion and a second portion, wherein the separating component decreases a height of channel measured from the planar top surface of the metal layer to a bottom surface of the separating component, wherein the first portion comprises liquid metal and wherein the second portion comprises gas, and wherein the liquid metal expands or contracts within the channel between the first and the second portions in response to external stimuli, and wherein the liquid metal expanding or contracting within the channel changes electrical characteristics of the device; and
   a cap encapsulating the channel and the separating component within, wherein the cap changes dimensions in response to the external pressure, thereby causing the liquid metal to expand or contract, and wherein the expansion or contraction of the liquid metal indicates a value of the external pressure.

8. The device as described by claim 7, wherein the substrate comprises a polymer.

9. The device as described by claim 7, wherein the separating component is a nozzle.

10. The device as described by claim 7 further comprising:
    switches configured to couple liquid metal sensors of the array to one another, and wherein the switches are configured to dynamically control one or more liquid metal sensors of the array.

11. The device as described by claim 7, wherein a height of the array is less than 50 micrometers.

12. The device as described by claim 7, wherein the liquid metal comprises Gallium.

13. The device as described by claim 7, wherein the electrical characteristics are selected from a group consisting of capacitive value, inductance value, resistance value, and resonance frequency.

14. The device as described by claim 7, wherein the external stimuli is pressure, and wherein the device further comprises a circuitry configured to measure the changes in the electrical characteristics of the array and further configured to convert the measure changes to a pressure value associated with the external pressure.

15. The device as described by claim 7, wherein a height or length of the liquid metal within the channel changes responsive to the external stimuli.

\* \* \* \* \*